United States Patent [19]
Holland

[11] Patent Number: 4,748,411
[45] Date of Patent: May 31, 1988

[54] PHASE ENCODING TECHNIQUE FOR MORE RAPID MAGNETIC RESONANCE IMAGING

[75] Inventor: G. Neil Holland, Chagrin Falls, Ohio

[73] Assignee: Picker International, Inc., Highland Hts., Ohio

[21] Appl. No.: 16,544

[22] Filed: Feb. 19, 1987

[51] Int. Cl.$^4$ .............................................. G01R 33/20
[52] U.S. Cl. ...................................... 324/309; 324/312
[58] Field of Search ............... 324/307, 309, 310, 312, 324/313, 314

[56] References Cited

U.S. PATENT DOCUMENTS

| | | | |
|---|---|---|---|
| 4,472,683 | 9/1984 | Sekihara et al. | 324/307 |
| 4,593,247 | 6/1986 | Glover | 324/307 |
| 4,644,280 | 2/1987 | Paltiel | 324/309 |
| 4,684,893 | 8/1987 | Kojima et al. | 324/309 |

OTHER PUBLICATIONS

Book of Abstracts, SMRM 1985, p. 1030, "Strip-Scan: A Method for Faster NMR Imaging".

Primary Examiner—Stewart J. Levy
Assistant Examiner—Kevin D. O'Shea
Attorney, Agent, or Firm—Fay, Sharpe, Beall, Fagan, Minnich & Mckee

[57] ABSTRACT

Each view of a magnetic resonance image is phase encoded with one of a plurality of phase encode gradients which vary from each other by a multiple of a phase encode gradient interval or step. For a given field of view, the resolution is determined by the upper and lower limit phase encode gradient angles. The larger the limit angle, the finer the resolution. When the imaged subject is shorter in dimension along the phase encode axis than the dimension of the field of view of the image along the phase encode axis, a portion of dead space other than the subject is imaged. To shorten the imaging time, the number of views is reduced in accordance with the ratio of the object dimension to the field of view. The size of the phase encode gradient steps or intervals are increased by the same ratio such that a reduced number of views spans the same upper and lower phase encode gradient angle limits. This stretches the resultant image. When a generated image representation in an image memory is displayed, an inverse zoom reduces the dimension of the resultant display by the inverse of the ratio such that the man readable display is returned to the proper scale. Along a frequency encode axis which is transverse to the phase encode axis, a bandwidth of frequencies corresponding to extremes of a projection of the subject are determined. Received resonance signals are filtered to remove frequency components which are outside of the determined bandwidth.

19 Claims, 2 Drawing Sheets

PHASE ENCODING TECHNIQUE FOR MORE RAPID MAGNETIC RESONANCE IMAGING

BACKGROUND OF THE INVENTION

The present invention pertains to the art of magnetic resonance imaging. It finds particular application in conjunction with medical diagnostic imaging and will be described with particular reference thereto. It is to be appreciated, however, that the invention may have broader applications.

Heretofore, magnetic resonance images were each composed of a plurality of views, e.g. 256 views. The data for each view was collected subsequent to the application of a different amplitude phase encode gradient along a phase encode axis. More specifically, each of the 256 views was collected in conjunction with one of 256 phase encode gradient amplitudes. The phase encode gradient was stepped in equal steps or intervals along the phase encode axis to assume each of 256 amplitudes. Analogously, for a coarser 128 view image, the phase encode gradient was stepped in 128 equal steps and, for a higher resolution 512 view image, the phase encode gradient was stepped in 512 equal steps.

In magnetic resonance imaging, the field of view, FOV, varied with the number of phase encode gradient steps or views, N, and the resolution Δ, specifically:

$$FOV = N\Delta \quad (1).$$

Thus, for a selected field of view, a finer resolution can be achieved by increasing the number of views. The phase encode gradient steps or intervals, ΔG were fixed for a given field of view and varied inversely therewith, i.e.:

$$\Delta G = (2\gamma FOV \cdot t_\phi)^{-1} \quad (2),$$

where γ is the gyromagnetic ratio and $t_\phi$ is the duration of the gradient. Thus, to decrease the field of view the phase encode gradient steps were increased accordingly. The maximum phase encode gradient, $G_{max}$ was inversely proportional to the resolution, specifically:

$$G_{max} = (4\gamma t_\phi \Delta)^{-1} \quad (3)$$

Thus, for a selected resolution the maximum phase encode gradient was fixed regardless of the selected field of view. For a given field of view, the size of the phase encode gradient steps was fixed. To improve resolution, the number of steps was increased which raised the maximum phase encode gradient.

Commonly, magnetic resonance imagers were preprogrammed such that the operator could select one of a limited number of field of view dimensions and one of a limited number of resolutions.

One of the disadvantages of the prior art scanners was that the imaged patient or subject rarely filled the field of view. Rather, a significant portion of the field of view was dead space or air of no diagnostic value. Collecting views corresponding to the dead space not only wasted scanning time but also caused artifacts which degraded the overall image quality.

In accordance with the present invention, a method and apparatus are provided for eliminating views corresponding to dead space to increase imaging speed and to decrease artifacts.

SUMMARY OF THE INVENTION

In accordance with one aspect of the present invention, the electronic image representation is stretched in the phase encode direction until the subject fills the selected field of view by increasing the size of the phase encode gradient steps or intervals. Before displaying the image, an inverse fractional zoom is performed on the data along the phase encode axis such that the displayed man readable image of the subject is contracted back to its true size and proportion.

More specifically, each phase encode gradient amplitude step is increased which would increase the image resolution if the number of views were held constant. The number of views is reduced to restore the original resolution. Because the acquisition time is directly related to the number of views or number of phase encoding steps, the total image acquisition time is reduced. This effectively alters the field of view in the phase encode direction without a corresponding alteration in the field of view along the frequency encode direction which distorts the resultant image. An inverse zoom means corrects the distortion for easier viewing.

In accordance with another aspect of the present invention, a method of magnetic resonance imaging is provided. A field of view is selected for a generated image. The field of view extends in one direction along a frequency encode axis and in another direction along a phase encode axis. The field of view corresponds to a preselected imaged region within the subject such that the imaged region is depicted within and corresponds to the selected field of view. A dimension along the phase encode axis of a region of interest within the imaged region is determined. An incremental step between phase encode amplitudes of each of a plurality of views is adjusted in accordance with the difference between the dimension of the region of interest and the limits of the field of view along the phase encode axis. In this manner, the region of interest is distorted, preferably stretched, along the phase encode axis to match the limits of the field of view. A plurality of views are collected with the adjusted phase encode gradient amplitudes. As the views are converted into an image display, the spatial dimensions of the image are altered, preferably contracted, along the phase encode axis such that the image of the region of interest is returned to its true, original scale.

In accordance with another aspect of the present invention, a magnetic resonance imaging method is provided. A first magnetic resonance image view is collected without a phase encode gradient such that a first projection of a subject in an image region along a first axis is obtained. The gradient direction is rotated and a second view without a phase encode gradient is generated to create a second projection of the subject along a second axis. The widths of the first and second projections are determined and compared to find which projection is the wider. The phase encode direction is oriented along the axis of the smaller projection width. A ratio of the larger projection width with the smaller projection width is determined. A phase encode gradient interval or step between adjacent views is multiplied by the ratio. The total number of views to be taken per image is similarly divided by the ratio. The reduced number of views are taken with the altered phase encode gradient interval to generate an image representation. In this manner, the image representation eliminates views which correspond to areas of a field of view that are beyond the subject.

In accordance with another aspect of the present invention, a magnetic resonance imaging method is provided in which data is phase encoded along a first axis and frequency encoded along a second axis. A dimension of the imaged object along the frequency encoded axis is determined. Frequencies corresponding to the dimensions of the imaged subject along the frequency encode axis are determined and frequencies outside of this range are filtered. In this manner, frequency encoded data corresponding to dead space beyond the imaged subject is discarded.

In accordance with a more limited aspect of the present invention, the subject is symmetrized within the field of view by centering a frequency bandwidth midway between the extremes of the imaged subject along the frequency encode axis such that data corresponding to the subject falls in a frequency band of $f_0 \pm \Delta f$.

In accordance with another aspect of the present invention, a magnetic resonance imaging apparatus is provided. A main magnetic field means generates a generally uniform magnetic field longitudinally through an image region. A magnetic resonance excitation means applies magnetic resonance excitation pulses, each with a selected center frequency to excite magnetic resonance of dipoles in the image region. A phase encode means applies phase encode gradients to phase encode the image region along a phase encode axis. A frequency encode gradient means frequency encodes the image region along a frequency encode axis. An axis rotating means selectively adjusts an orientation of the phase encode and frequency encode axes. A radio frequency receiver receives radio frequency signals emanating from the image region and a filter means filters the received signals. An image reconstructing means reconstructs a plurality of views from the filtered resonance signals into an image representation. Each of the views having been generated with a different phase encode gradient, which phase encode gradients vary by a multiple of a selected phase angle. An image memory stores the reconstructed image representation. A projection means measures projections of a subject in the image region at least along first and second axes. A projection comparing means compares the widths of the measured projections and causes the axis direction control means to adjust the phase and frequency encode axes such that the phase encode axis aligns with the axis corresponding to the smaller projection width.

One advantage of the present invention is that it speeds imaging time. The data collected for one image is reduced with no reduction in the resolution of the resultant image.

Another advantage of the present invention is that it reduces artifacts, particularly artifacts attributable to material in an imaged region which is outside of the subject being imaged, e.g. dead air surrounding the patient.

Still further advantages of the present invention will become apparent to those of ordinary skill in the art upon reading and understanding the following detailed description of the preferred embodiment.

BRIEF DESCRIPTION OF THE DRAWINGS

The invention may take form in various steps and arrangements of steps and in various components and arrangements of components. The drawings are only for purposes of illustrating a preferred embodiment and are not to be construed as limiting the invention.

DETAILED DESCRIPTION OF THE PREFERRED EMBODIMENT

Figure 1:
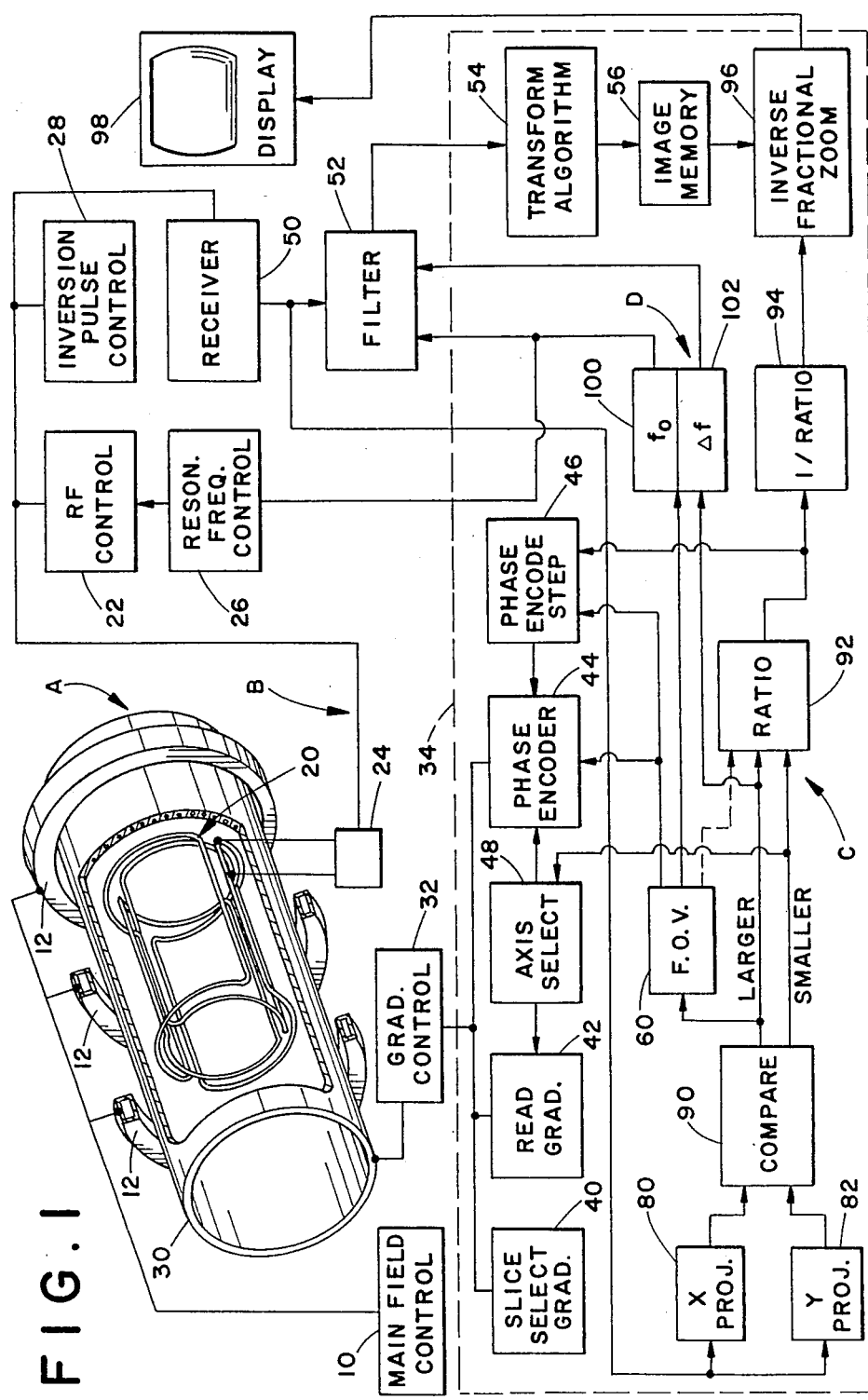
FIG. 1 is a diagrammatic illustration of a magnetic resonance imaging apparatus in accordance with the present invention; and, FIG. 2 illustrates a technique for determining dimensions of an imaged subject along two axes.

With reference to FIG. 1, a magnetic resonance imager includes a coil assembly A and imaging electronics B for generating electronic image representations. A phase encode gradient adjustment means C selectively alters the phase encoding in the imaging sequence to focus the image more precisely on a selected subject. Preferably, the phase encode means adjusts the dimension of the examined region of interest in the phase encode direction to match the field of view. The adjustment stretches and distorts the resultant image in the phase encode direction. An inverse zoom compresses the imaged data during display to correct the dimensionality and scaling of the resultant image. An automatic frequency filter means D automatically adjusts the filtering of extraneous magnetic resonance signal frequencies. Preferably, the filter means eliminates frequency components which fall outside of a selected subregion of the imaged region.

A main magnetic field control circuit 10 provides the appropriate electrical power to main magnetic field coils 12 to generate a substantially uniform main magnetic field longitudinally through an image region.

A magnetic resonance excitation means selectively excites magnetic resonance of magnetic dipoles within the image region. The resonance excitation means includes a radio frequency antenna 20 for irradiating the dipoles with a radio frequency (RF) excitation signal. An RF or resonance excitation control circuit 22 selectively causes pulses having selected bandwidth of radio frequency energy to be conveyed through an interface 24 to the antenna 20 to cause magnetic resonance. A frequency control means 26 selectively adjusts and controls the bandwidth and center frequency of the RF excitation signal by the RF control circuit 22. A pulse control circuit 28 selectively applies 90° and 180° rotation pulse and other magnetic resonance manipulation pulses for selectively manipulating the resonating dipoles.

A gradient field control means provides magnetic field gradient pulses of the appropriate amplitude, duration, and timing across the image region to select a limited region or slice(s) to be imaged and to encode the spatial position and magnetic resonance properties of resonating dipoles. A gradient field coil 30 receives current pulses from a gradient field controller 32. A computer 34 includes subroutines which select appropriate series of gradient pulses and cause the gradient field controller to apply the appropriate currents to the gradient coils to produce the selected gradient pulses.

A slice select gradient control routine or means 40 causes a slice select magnetic field gradient along the main magnetic field which selects one or more planes or slices transverse to the main magnetic field to be imaged. A read gradient control routine or means 42 causes the gradient coil 30 to generate a magnetic field transverse across the selected slice for frequency encoding spatial position of resonating dipoles along the frequency encode axis. Commonly, the read gradient magnitude is selected in accordance with the resonance excitation control frequency such that a central frequency of the resonance excitation pulse corresponds to dipoles at the center of the frequency encode axis. The magnitude of the gradient is also selected such that the bandwidth of the magnetic resonance excitation signal corresponds to a preselected region to be imaged, i.e. corresponds to the edges of a selected field of view along the frequency encode axis. By adjusting the center frequency of the resonance excitation frequency with the frequency control means 26, or by adding an offset to the read gradient, the position corresponding to the center frequency along the frequency encode axis can be selectively adjusted.

A phase encode routine or means 44 selects phase encode gradients for phase encoding resonance along a phase encode axis. Conventionally, the phase encode axis extends along the selected slice perpendicular to the frequency code axis. After the excitation of magnetic resonance, one or more echoes are commonly caused by manipulating magnetic resonance with the control circuit 28. The echoes are each encoded with one of a plurality phase encode angles, each phase encode angle corresponding to one view of a resultant image. With no phase encode gradient, the resultant image represents a projection perpendicular to the frequency encode direction, i.e. onto the phase encode axis. The phase encode gradient is stepped at regular phase angles from view to view. Particularly, the amplitude of the phase encode gradient is stepped at regular intervals. A step control routine or means 46 selectively adjusts the magnitude of the steps or intervals between phase encode gradients of adjacent views. A phase encode axis and frequency encode axis direction selection routine or means 48 selectively rotates or adjusts the orientation of the frequency encode and phase encode axes. For example, the axis direction selection routine or means 48 may cause the phase encode axis to be horizontal and the frequency encode axis to be horizontal, or may reverse the two axes causing the phase encode axis to be horizontal and the frequency encode axis to be vertical. The axis direction selection routine or means 48 may also cause the slice select or frequency axes to be disposed at selectable angles offset from vertical and horizontal.

A receiver 50 receives the radio frequency magnetic resonance signals which have audio frequency encoded components. To separate the audio frequency encoded signals from the radio frequency signals, the receiver commonly includes a heterodyne circuit. The heterodyne circuit removes the radio frequency component leaving an audio frequency signal that is centered about the center frequency $f_o$ and has the bandwidth $\Delta f$ as selected by the resonance frequency control circuit 26. Commonly, the center frequency of the audio signal is adjustable at the receiver. Accordingly, frequency adjustments to center the region of interest along the frequency encode axis may be done at the receiver 50. A selectively adjustable filter 52 filters each audio frequency component to remove frequencies that are beyond the preselected bandwidth, i.e. represent regions that are outside of the preselected field of view. The computer 34 further includes a transform algorithm routine or means 54 which operates on the radio frequency signals to create digital electronic views which are stored in an image memory 56. A computer also controls the relative timing and operating sequence of the resonance excitation means, the gradient field control routine, the resonance signal receiving means, and the transform routine.

Figure 2:
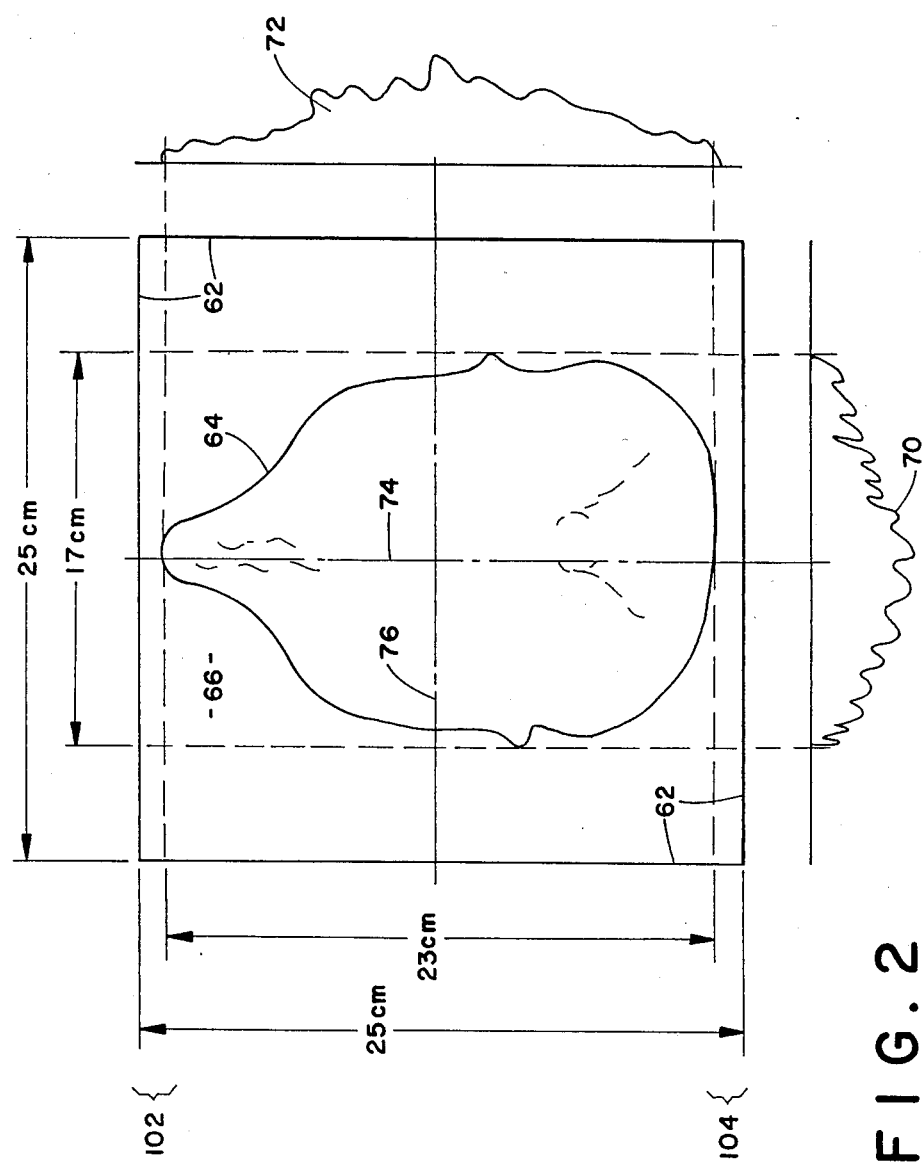

A field of view selection routine or means 60 selects a field of view—commonly dimensions of a square within the slice selected by the slice gradient routine 40 to be represented in the image. That is, the selected field of view corresponds to a corresponding square portion of the selected slice, i.e. the imaged region of the subject. As illustrated in FIG. 2, when imaging a slice through the patient's head, a 25 cm image field of view 62 encompasses the slice through a patient 64 as well as surrounding air or dead space 66. That is, the imaged region includes the slice of the patient as well as a slice of the surrounding ambient surrounding air. The amount of surrounding dead space is in part a function of the dimensions of the video display screen. Because a display screen has a fixed height to width ratio which is frequently different from the height to width or aspect ratio of the examined subject, a certain amount of dead space of necessity falls in the field of view. Moreover, conventionally only a fixed number of fields of view are provided. A field of view for a head section is normally selected of a sufficient magnitude as to encompass the largest patient which might reasonably be expected. Smaller patients will fill less of the field of view and have more dead space around the slice. As indicated above, images of the dead space surrounding the patient slice are normally of no diagnostic value. Worse, the dead space may contain artifacts.

Two resonance excitation sequences are run with views with no phase encode gradient only a read (or frequency encoding) gradient. First and second views are generated from the resultant resonance signals. The second view is taken with the frequency encode axis rotated 90° from the first view such that after Fourier transformation two projections 70, 72 of the subject are created along first and second axes 74, 76. The first or x projection 70 is monitored by an x projection monitoring routine or means 80 and the second or y axis projection 72 is monitored by a y axis projection monitoring routine or means 82. The x and y axes projection routines measure the width of the first and second projections.

A comparing routines or means 90 compares the frequency widths of the projections along the first and second axes. The axes with the smaller of the two lengths is selected as the phase encode axis. The comparing means 90 causes the axis direction selection routine 48 to rotate the frequency and phase encode axes such that the phase encode axes coincides with the axis with the smaller projection, width.

The field of view selecting routine 60 is connected with the comparing routine 90 such that the field of view is selected or adjusted to accomodate the projection widths. Specifically, the smallest field of view is selected that allows the horizontal width of the field of view to accomodate the horizontal projection width and the vertical width of the field of view to accomodate the vertical projection width. As a practical matter, the 1:1 aspect ratio of a conventional square monitor dictates that if the larger projection width fits in the field of view both will fit. Accordingly, the larger projection width alone may be utilized to select the field of view.

When the field of view of the image is selected in accordance with the larger projection width, a ratio routine or means 92 determines the ratio of the larger projection width to the smaller projection width. Alternately, the ratio of the smaller projection width to the corresponding field of view dimension may be taken, particularly if the field of view is manually selected. The magnitude of the phase encode steps or increments as set by the phase encode step routine 46 is adjusted in accordance with the ratio.

By way of example, the head slice of FIG. 2 is 17 cm×23 cm. In conventional imaging, a 25 cm square field of view is selected, i.e. the smallest standard field of view that accomodates the entire slice. Next the operator would select the number of views, typically 128 or 256. Selecting 256 views with a 25 cm field of view is shown by the relationship of Equation (1) to provide a resolution of about 1 mm, i.e. 25 cm÷256=1 mm.

The next step is to determine how many rows or columns of the image actually span the image. In the FIG. 2 slice, 17 cm is the smallest dimension. The smallest dimension thus spans 17/25th of the selected 256 columns, i.e. 174 columns. For a field of view of 17 cm instead of 25 cm along the phase encode axis 76, only 174 views are necessary to maintain the same 1 mm, resolution. To collect the image with 1 mm resolution, 174 views are collected with phase encode gradient steps that are 25/17th the size which the gradient steps would have been at 256 views, i.e. $\Delta G_{174} = (25/17)\Delta G_{256}$. It will be noted that the maximum phase encode angle of the 174th view is the same as the 256th view would have had if the gradient steps had not been enlarged, i.e. $G^{max} = (174/2)\Delta G_{174} = (256/2)\Delta G_{256}$.

A ratio inverting routine or means 94 inverts the ratio determined by the ratio routine 92. In the foregoing example, 25/17 becomes 17/25. An inverse zoom means 96 performs an inverse zoom on the image representation as it is converted from the electronic data format of the image memory 56 into a man readable display on a video monitor or other display 98. That is, the inverse zoom contracts the dimension along the phase encode axis by the inverse of the amount by which it was expanded. Thus, the image representation of the object which was stretched along the phase encode axis to 25/17 times its actual scale to fill a 25 cm display with a 17 cm dimension is contracted back to its original 17 cm size. Black, white, or another preselected background color fills the empty 8 cm of the display. Optionally, another image memory may be disposed between the inverse zoom routine and the display. If the image is to be recorded on disc or tape, the stored image may be stored either after or before the inverse zoom.

The axis along which the larger projection width is defined is assigned to be the frequency encode axis. The center of the larger projection and the frequency $f_o$ corresponding thereto are determined. If a center frequency routine or means 100 determines that the center of the object is off center from the center of the field of view, hence from the central resonance frequency, the the central resonance frequency may be shifted such that the projection centered about the central resonance frequency. The central resonance frequency may be shifted either at the resonance frequency control 26 or the heterodyning stage of the receiver 50. Because audio frequency signal components received through the filter 52 define a bandwidth which is centered about the central resonance frequency, the projection center frequency is at the center of the filter bandwidth. A bandwidth determining routine or means 102 determines the frequencies which correspond to the edges of the wider projection. The bandwidth determining routine adjusts the bandwidth of the adjustable filter 52 to correspond to the determined bandwidth. That is, the frequency components from outside the bandwidth or spectrum which corresponds to the projection along the frequency encode axis are filtered out and discarded. In the example of FIG. 2, the frequency that correspond to the two 1 cm rows 102, 104 at the extremes of the image are filtered. This removes signal components which purport to be attributable to structure within the dead space beyond the subject along the frequency encode axis.

The invention has been described with reference to the preferred embodiment. Obviously, alterations and modifications will occur to others upon reading and understanding the preceding specification. It is intended that the invention be construed as including all such alterations and modifications insofar as they come within the scope of the appended claims or the equivalents thereof.

Having thus described the preferred embodiment, the invention is now claimed to be:

1. In a method of magnetic resonance imaging in which each view of a plurality of views is phase encoded along one axis by a corresponding one of a plurality of phase encode gradient steps, the phase encode gradient step varying between upper and lower limits by multiples of a preselected increment, the improvement comprising:
    increasing the gradient steps increment such that fewer views are required to span the field of view limits, whereby the image representation is stretched along the one axis;
    in conjunction with creating a man readable image display, contracting a scale of the image representation along said one axis, whereby the image display is contracted along the one axis.

2. The method as set forth in claim 1 wherein the gradient steps increment is increased by a first percentage and the image scale is contracted by said first percentage, whereby in the contracting step the image representation is contracted back to its original scale for display.

3. The method as set forth in claim 2 further including:
    measuring a dimension of a subject to be imaged along the one axis;
    selecting the first percentage in accordance with a ratio of the measured dimension and a field of view along the one axis.

4. The method as set forth in claim 3 wherein the dimension measuring step includes:
    scanning the object without a phase encode gradient to generate a projection of the object along the one axis; and,
    measuring a width of the projection.

5. The method as set forth in claim 1 further including:
    generating a first projection of the object along a first axis;
    measuring a width of the first projection;
    generating a second projection of the object along a second axis orthogonal to the one axis;
    measuring a width of the second projection;
    comparing the first and second projection widths to determine the shorter;
    aligning said one axis with the axis along which the projection width is shorter, whereby the phase encode axis is along the subject's shorter dimension.

6. The method as set forth in claim 5 further including:
   determining a ratio of the first and second projection widths;
   in the gradient step increment increasing step, increasing the gradient step increment by the ratio;
   in the scale reducing step, reducing the scale in accordance by the ratio.

7. The method as set forth in claim 1 further including:
   displaying the image display on a monitor such that the contracted scale image does not fill the field of view; and,
   filling in unfilled portions of the displayed image with a preselected background.

8. A method of magnetic resonance imaging, the method comprising:
   selecting a field of view for a generated image, which field of view extends in one direction along a frequency encoding axis and in another direction along a phase encode axis, the field of view corresponding to a preselected image region within a subject such that the imaged region is depicted within the image field of view, the imaged region including a region of interest therein such that the region of interest is depicted in the generated image;
   determining a dimension of the region of interest along the phase encode axis;
   adjusting an incremental step between phase encode gradient amplitudes of each of a plurality of views in accordance with a difference between the dimension of the region of interest along the phase encode axis and limits of the field of view along the phase encode axis such that the region of interest is distorted along the phase encode axis to match the limits of the field of view along the phase encode axis;
   collecting a plurality of views with the adjusted phase encode gradient amplitudes;
   as the views are converted into the image, altering spatial dimensions of the image along the phase encode axis such that the depiction of the region of interest in the image is returned to an original scale.

9. The method as set forth in claim 8 further including filling areas within the field of view left empty by altering the spatial dimensions of the image along the phase encode axis with a preselected background.

10. The method as set forth in claim 8 wherein the step of determining the dimension of the region of interest along the phase encode axis includes determining a ratio between the limits of the field of view along the phase encode axis and the dimensions of the region of interest along the phase encode axis and wherein the step of adjusting the phase encode gradient steps includes enlarging the gradient steps by the ratio and wherein the step of altering the image spatial dimension includes contracting the image along the phase encode axis by the inverse of the ratio.

11. The method as set forth in claim 8 further including determining a dimension of the region of interest along the frequency encode axis;
   determining a frequency spectrum corresponding to the frequency encode axis dimension;
   filtering frequency components outside of the determined frequency spectrum of received resonance signals before transforming the resonance signals into the plurality of views.

12. A method of magnetic resonance imaging, the method comprising:
   collecting a first magnetic resonance image view without a phase encode gradient such that a first projection of a subject in an imaging region along a first axis is obtained;
   without a phase encode gradient, generating a second projection of the subject along a second axis;
   determining widths of the first projection and the second projection;
   determining the larger and smaller of the first and second projection widths;
   determining a ratio of the larger projection width to the smaller projection width;
   multiplying a phase encode gradient interval between adjacent views by the ratio and dividing the number of views to be taken per image by the ratio;
   taking the reduced number of views each with a phase encode gradient that varies by the ratio adjusted interval to generate an image representation with the reduced number of views, whereby the image representation eliminates views which correspond to areas of a field of view that are beyond the subject.

13. The method as set forth in claim 12 further including:
   determining a projection centering ratio of distances between a center of the field of view and extremes of the smaller projection width;
   multiplying dimensions of the image representation along the phase encode axis by the projection centering ratio whereby the subject fills the field of view along the phase encode axis.

14. The method as set forth in claim 12 further including:
   positioning the larger width projection along a frequency encode axis;
   determining a spectrum of frequencies corresponding to extremes of the larger projection width;
   filtering received resonance signals to eliminate resonance signals with frequencies outside of the determined frequency spectrum.

15. A method of magnetic resonance imaging, the method comprising:
   generating a projection of a subject to be imaged along a frequency encode axis;
   determining a spectrum of frequencies corresponding to points along the frequency encode axis between edges of the projection;
   while collecting magnetic resonance signals, filtering signals with frequencies outside the determined frequency spectrum, whereby signals with frequencies which do not correspond to the subject are filtered.

16. The method as set forth in claim 15 further including:
   determining a projection of the subject along a phase encode axis, which phase encode axis is perpendicular to the frequency encode axis;
   determining a ratio of the projections along the frequency and phase encode axes;
   adjusting a number of views per image and a phase encode angle between views in accordance with the ratio.

17. An apparatus for magnetic resonance imaging, the apparatus comprising:

a main magnetic field means for generating a generally uniform magnetic field longitudinally through an image region:

a magnetic resonance excitation means for applying a magnetic resonance excitation pulse with a selected center frequency to excite magnetic resonance of dipoles in the image region;

a phase encode means for applying phase encode gradients to phase encode the image region along a phase encode axis;

a frequency encode gradient means for frequency encoding the image region along a frequency encode axis;

an axis rotating means for selectively adjusting an orientation of the phase encode and frequency encode axes;

a radio frequency receiver for receiving radio frequency resonance signals emanating from the image region;

a filter means for filtering received resonance signals outside of a selected frequency range;

an image reconstructing means for reconstructing a plurality of views from the filtered resonance signals into an image representation, each view being generated with a different phase encode gradient, which phase encode gradients vary by a multiple of a selected phase angle;

an image memory for storing the reconstructed image representation;

projection measuring means for measuring projections of a subject in the image region at least along first and second axes;

a projection comparing means for comparing widths of the measured projections, the projection comparing means being operatively connected with the axis direction control means for selectively adjusting the phase and frequency encode axes such that the phase encode axis aligns with the axis with the smaller projection width.

18. The apparatus as set forth in claim 17 further including a frequency spectrum determining means for determining a spectrum of frequencies which lie along the frequency encode axis corresponding to extremes of the width of the projection measured along the frequency encode axis, the frequency spectrum determining means being operatively connected with the filter means for adjusting the selected frequency range.

19. The apparatus as set forth in claim 17 further including:

a ratio determining means for determining a ratio of the projection widths of the subject along the phase encode axis to limits of a field of view of a display means for displaying a resultant man-readable image along the phase encode axis, the ratio determining means being operatively connected with the phase encode means for adjusting the selected phase angle by the ratio;

an inverse zoom means operatively connected with the ratio means for reducing the magnitude of the resultant image along the phase encode axis in accordance with the ratio, the inverse zoom means being operatively connected between the image memory and the display means for converting the image representation into the resultant image.

* * * * *